(12) United States Patent
Sakamoto

(10) Patent No.: US 8,278,592 B2
(45) Date of Patent: Oct. 2, 2012

(54) LASER PROCESSING METHOD

(75) Inventor: Takeshi Sakamoto, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 559 days.

(21) Appl. No.: 12/441,677

(22) PCT Filed: Sep. 13, 2007

(86) PCT No.: PCT/JP2007/067828
§ 371 (c)(1),
(2), (4) Date: May 6, 2009

(87) PCT Pub. No.: WO2008/035610
PCT Pub. Date: Mar. 27, 2008

(65) Prior Publication Data
US 2010/0012632 A1    Jan. 21, 2010

(30) Foreign Application Priority Data
Sep. 19, 2006    (JP) .............................. P2006-253311

(51) Int. Cl.
  *H01L 21/301* (2006.01)
  *B23K 26/38* (2006.01)
(52) U.S. Cl. .................................... 219/121.72; 438/463
(58) Field of Classification Search ............. 219/121.69, 219/121.72; 438/463
See application file for complete search history.

(56) References Cited

U.S. PATENT DOCUMENTS

| | | | |
|---|---|---|---|
| 6,992,026 B2 | 1/2006 | Fukuyo et al. | |
| 7,396,742 B2 | 7/2008 | Fukuyo et al. | |
| 7,489,454 B2 | 2/2009 | Fukuyo et al. | |
| 7,547,613 B2 | 6/2009 | Fukuyo et al. | |
| 7,566,635 B2 | 7/2009 | Fujii et al. | |
| 7,592,237 B2 | 9/2009 | Sakamoto et al. | |
| 7,592,238 B2 | 9/2009 | Fukuyo et al. | |
| 7,605,344 B2 | 10/2009 | Fukumitsu | |
| 7,608,214 B2 | 10/2009 | Kuno et al. | |
| 7,615,721 B2 | 11/2009 | Fukuyo et al. | |

(Continued)

FOREIGN PATENT DOCUMENTS

JP    2004-343008    12/2004

(Continued)

OTHER PUBLICATIONS

U.S. Appl. No. 10/594,907, filed Aug. 7, 2008, Sakamoto et al.

(Continued)

*Primary Examiner* — Geoffrey S Evans
(74) *Attorney, Agent, or Firm* — Drinker Biddle & Reath LLP

(57) ABSTRACT

While six rows of molten processed regions $13_1$, $13_2$ to become a cutting start point are formed within a silicon wafer 11 along a line to cut 5, a weakened region 18 is formed in a rear face 21 of an object to be processed 1 along the line to cut 5 when forming the molten processed region $13_1$ closest to the rear face 21. Since the molten processed regions $13_1$, $13_2$ are thus formed within the silicon wafer 11, particles can be prevented from occurring from the molten processed regions $13_1$, $13_2$. Also, since the weakened region 18 having a predetermined depth is formed on the rear face 21 of the object 1 along the line to cut 5, the object 1 can be cut along the line to cut 5 with a relatively small external force.

4 Claims, 22 Drawing Sheets

U.S. PATENT DOCUMENTS

| | | | |
|---|---|---|---|
| 7,626,137 B2 | 12/2009 | Fukuyo et al. | |
| 7,709,767 B2 | 5/2010 | Sakamoto | |
| 7,718,510 B2 | 5/2010 | Sakamoto et al. | |
| 7,719,017 B2 | 5/2010 | Tanaka | |
| 7,732,730 B2 | 6/2010 | Fukuyo et al. | |
| 7,749,867 B2 | 7/2010 | Fukuyo et al. | |
| 7,754,583 B2 | 7/2010 | Sakamoto | |
| 7,825,350 B2 | 11/2010 | Fukuyo et al. | |
| 7,897,487 B2 | 3/2011 | Sugiura et al. | |
| 7,902,636 B2 | 3/2011 | Sugiura et al. | |
| 7,939,430 B2 | 5/2011 | Sakamoto et al. | |
| 7,947,574 B2 | 5/2011 | Sakamoto et al. | |
| 2005/0009301 A1* | 1/2005 | Nagai et al. | 438/463 |
| 2005/0199592 A1* | 9/2005 | Iri et al. | 219/121.6 |
| 2005/0202596 A1 | 9/2005 | Fukuyo et al. | |
| 2005/0272223 A1 | 12/2005 | Fujii et al. | |
| 2006/0144828 A1 | 7/2006 | Fukumitsu et al. | |
| 2006/0148212 A1 | 7/2006 | Fukuyo et al. | |
| 2006/0255024 A1 | 11/2006 | Fukuyo et al. | |
| 2007/0085099 A1 | 4/2007 | Fukumitsu et al. | |
| 2007/0111480 A1* | 5/2007 | Maruyama et al. | 438/463 |
| 2007/0125757 A1 | 6/2007 | Fukuyo et al. | |
| 2007/0158314 A1 | 7/2007 | Fukumitsu et al. | |
| 2007/0252154 A1 | 11/2007 | Uchiyama et al. | |
| 2007/0287267 A1 | 12/2007 | Sakamoto et al. | |
| 2007/0290299 A1 | 12/2007 | Sakamoto et al. | |
| 2008/0000884 A1 | 1/2008 | Sugiura et al. | |
| 2008/0035611 A1 | 2/2008 | Kuno et al. | |
| 2008/0037003 A1 | 2/2008 | Atsumi et al. | |
| 2008/0090382 A1 | 4/2008 | Fujii et al. | |
| 2008/0218735 A1 | 9/2008 | Atsumi et al. | |
| 2008/0251506 A1 | 10/2008 | Atsumi et al. | |
| 2009/0008373 A1 | 1/2009 | Muramatsu et al. | |
| 2009/0026185 A1 | 1/2009 | Sakamoto | |
| 2009/0032509 A1 | 2/2009 | Kuno et al. | |
| 2009/0081851 A1 | 3/2009 | Sakamoto et al. | |
| 2009/0098713 A1 | 4/2009 | Sakamoto | |
| 2009/0107967 A1 | 4/2009 | Sakamoto et al. | |
| 2009/0117712 A1* | 5/2009 | Sakamoto et al. | 438/463 |
| 2009/0166342 A1 | 7/2009 | Kuno et al. | |
| 2009/0166808 A1 | 7/2009 | Sakamoto et al. | |
| 2009/0250446 A1* | 10/2009 | Sakamoto | 219/121.72 |
| 2009/0261083 A1 | 10/2009 | Osajima et al. | |
| 2009/0302428 A1 | 12/2009 | Sakamoto et al. | |
| 2010/0006548 A1 | 1/2010 | Atsumi et al. | |
| 2010/0009547 A1 | 1/2010 | Sakamoto | |
| 2010/0012633 A1 | 1/2010 | Atsumi et al. | |
| 2010/0015783 A1 | 1/2010 | Fukuyo et al. | |
| 2010/0025386 A1 | 2/2010 | Kuno et al. | |
| 2010/0032418 A1 | 2/2010 | Kuno et al. | |
| 2010/0055876 A1 | 3/2010 | Fukuyo et al. | |
| 2010/0151202 A1 | 6/2010 | Fukumitsu | |
| 2010/0176100 A1 | 7/2010 | Fukuyo et al. | |
| 2010/0184271 A1 | 7/2010 | Sugiura et al. | |
| 2010/0200550 A1 | 8/2010 | Kumagai | |
| 2010/0203678 A1 | 8/2010 | Fukumitsu et al. | |
| 2010/0203707 A1 | 8/2010 | Fujii et al. | |
| 2010/0227453 A1 | 9/2010 | Sakamoto | |
| 2010/0240159 A1 | 9/2010 | Kumagai et al. | |
| 2010/0258539 A1 | 10/2010 | Sakamoto | |
| 2010/0301521 A1 | 12/2010 | Uchiyama | |
| 2010/0311313 A1 | 12/2010 | Uchiyama | |
| 2010/0327416 A1 | 12/2010 | Fukumitsu | |
| 2011/0000897 A1 | 1/2011 | Nakano et al. | |
| 2011/0001220 A1 | 1/2011 | Sugiura et al. | |
| 2011/0021004 A1 | 1/2011 | Fukuyo et al. | |
| 2011/0027971 A1 | 2/2011 | Fukuyo et al. | |
| 2011/0027972 A1 | 2/2011 | Fukuyo et al. | |
| 2011/0037149 A1 | 2/2011 | Fukuyo et al. | |
| 2011/0274128 A1 | 11/2011 | Fukumitsu et al. | |

FOREIGN PATENT DOCUMENTS

| | | |
|---|---|---|
| JP | 2005-057257 | 3/2005 |
| JP | 2005-109322 | 4/2005 |
| JP | 2005-123329 | 5/2005 |
| JP | 2006-068816 | 3/2006 |
| JP | 2006-140355 | 6/2006 |
| JP | 2006-305586 | 11/2006 |
| WO | WO-2005/098915 A1 * | 10/2005 |

OTHER PUBLICATIONS

U.S. Appl. No. 11/667,596, filed May 11, 2007, Sugiura et al.
U.S. Appl. No. 12/063,560, filed May 13, 2008, Sakamoto et al.
U.S. Appl. No. 12/094,050, filed Feb. 6, 2009, Sakamoto.
U.S. Appl. No. 12/159,338, filed Jun. 26, 2008, Sakamoto et al.
U.S. Appl. No. 12/305,497, filed Dec. 18, 2008, Sakamoto.
K. Hayashi, "Inner Glass Marking by Harmonics of Solid State Laser," Proceedings of the 45$^{th}$ Laser Materials Processing Conference, R&D Center Sumitomo Heavy Industries, Ltd., Dec. 1998, pp. 23-28, with English abstract.
T. Sano et al., "Ultrashort Pulse Laser Microprocessing of Silicon," Preprints of the National Meetings of Japan Welding Society, vol. 66, Apr. 2000, pp. 72-73, with English language translation.
K. Miura et al., "Formation of Photo-induced Structures in Glasses with Femtosecond Laser," Proceedings of the 42$^{nd}$ Laser Materials Processing Conference, Nov. 1997, pp. 105-111, with English abstract.
U.S. Appl. No. 13/206,181, filed Aug. 9, 2011.
U.S. Appl. No. 13/269,274, filed Oct. 7, 2011.
U.S. Appl. No. 13/235,936, filed Sep. 19, 2011.
U.S. Appl. No. 13/213,175, filed Aug. 19, 2011.
U.S. Appl. No. 13/233,662, filed Sep. 15, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/148,097, filed Aug. 26, 2011.
U.S. Appl. No. 13/262,995, filed Oct. 5, 2011.
U.S. Appl. No. 13/265,027, filed Oct. 18, 2011.

* cited by examiner

LASER PROCESSING METHOD

TECHNICAL FIELD

The present invention relates to a laser processing method for cutting a planar object to be processed including a semiconductor substrate along a line to cut.

BACKGROUND ART

Known as a conventional laser processing method is one irradiating a planar object to be processed with laser light while using one face of the object as a laser light entrance surface, so as to form a plurality of rows of modified regions to become a cutting start point within the object such that the modified regions align in a thickness direction of the object, wherein the modified region closest to the other face is exposed at the other face (see, for example, Patent Document 1). Patent Document 1: Japanese Patent Application Laid-Open No. 2005-123329

DISCLOSURE OF THE INVENTION

Problem to be Solved by the Invention

The above-mentioned laser processing method can cut the object with a relatively small external force along the line to cut even when the other face of the object is a metal film surface.

Since the modified region closest to the other face of the object in the plurality of rows of modified regions is exposed at the other face, however, particles may occur from this modified region in the above-mentioned laser processing method.

In view of such circumstances, it is an object of the present invention to provide a laser processing method which can prevent particles from occurring and can cut an object to be cut along a line to cut with a relatively small external force.

Means for Solving Problem

For achieving the above-mentioned object, the laser processing method in accordance with the present invention is a laser processing method of irradiating a planar object to be processed including a semiconductor substrate with laser light while using one face of the object as a laser light entrance surface, so as to form a plurality of rows of modified regions to become a cutting start point along a line to cut the object within the semiconductor substrate such that the modified regions align in a thickness direction of the object; the method comprising the steps of forming a weakened region having a predetermined depth along the line to cut simultaneously with the modified region closest to the other face of the object in the plurality of rows of modified regions; and forming a modified region other than the modified region closest to the other face in the plurality of rows of modified regions.

While this laser processing method forms a plurality of rows of modified regions to become a cutting start point within a semiconductor substrate along a line to cut such that the modified regions align in the thickness direction of the object, a weakened region having a predetermined depth is formed in the other face of the object along the line to cut when forming the modified region closest to the other face. Since each modified region is thus formed within the semiconductor substrate, particles can be prevented from occurring from the modified regions. Also, since the weakened region having a predetermined depth is formed in the other face along the line to cut, the object can be cut along the line to cut with a relatively small external force.

Each modified region is formed by generating multiphoton absorption or other kinds of optical absorption within the object by irradiating the object with laser light. The step of forming the modified region closest to the other face of the object in the plurality of rows of modified regions and the weakened region and the step of forming a modified region other than the modified region closest to the other face of the object in the plurality of rows of the modified regions may be performed in any order.

In the laser processing method in accordance with the present invention, the other face may be a surface of a metal film in the object. Even in this case, the object can be cut along the line to cut with a relatively small external force, since the weakened region having a predetermined depth is formed in the metal film surface along the line to cut.

Preferably, in the laser processing method in accordance with the present invention, the modified region closest to the other face and the weakened region are formed such as to be separated from each other. Consequently, the modified region closest to the other face of the object is formed at a position inwardly separated from the other face by a predetermined distance, whereby particles can more reliably be prevented from occurring from the modified regions.

Preferably, in the laser processing method in accordance with the present invention, the weakened region is formed like a dotted line along the line to cut. This makes it easier for stresses to concentrate at the weakened region when exerting an external force on the object, whereby the object can be cut along the line to cut with a smaller external force.

Preferably, the laser processing method in accordance with the present invention includes the step of cutting the object along the line to cut from the plurality of rows of modified regions and weakened region acting as a cutting start point. This can accurately cut the object along the line to cut.

In the laser processing method in accordance with the present invention, the plurality of rows of modified regions may include a molten processed region.

EFFECT OF THE INVENTION

The present invention can prevent particles from occurring and can cut the object along the line to cut with a relatively small external force.

EXPLANATION OF NUMERALS

1 . . . object to be processed; 3 . . . front face (one face); 5 . . . line to cut; 11 . . . silicon wafer (semiconductor substrate); 13$_1$, 13$_2$ . . . molten processed region (modified region); 17 . . . metal film; 18 . . . weakened region; 21 . . . rear face (other face); L . . . laser light

BEST MODE FOR CARRYING OUT THE INVENTION

In the following, a preferred embodiment of the present invention will be explained in detail with reference to the drawings. In the laser processing method in accordance with the embodiment, a phenomenon known as multiphoton absorption is used for forming a modified region within an object to be processed. Therefore, to begin with, a laser processing method for forming a modified region by the multiphoton absorption will be explained.

A material becomes transparent when its absorption bandgap $E_G$ is greater than photon energy hv. Consequently, a condition under which absorption occurs in the material is hv>$E_G$. However, even when optically transparent, the material generates absorption under a condition of nhv>$E_G$ (where n=2, 3, 4, . . . ) if the intensity of laser light becomes very high. This phenomenon is known as multiphoton absorption. In the case of pulsed waves, the intensity of laser light is determined by the peak power density (W/cm$^2$) of laser light at its converging point. The multiphoton absorption occurs under a condition where the peak power density is 1×10$^8$ (W/cm$^2$) or greater, for example. The peak power density is determined by (energy of laser light at the converging point per pulse)/ (beam spot cross-sectional area of laser light×pulse width). In the case of continuous waves, the intensity of laser light is determined by the field intensity (W/cm$^2$) of laser light at the converging point.

Figure 1:
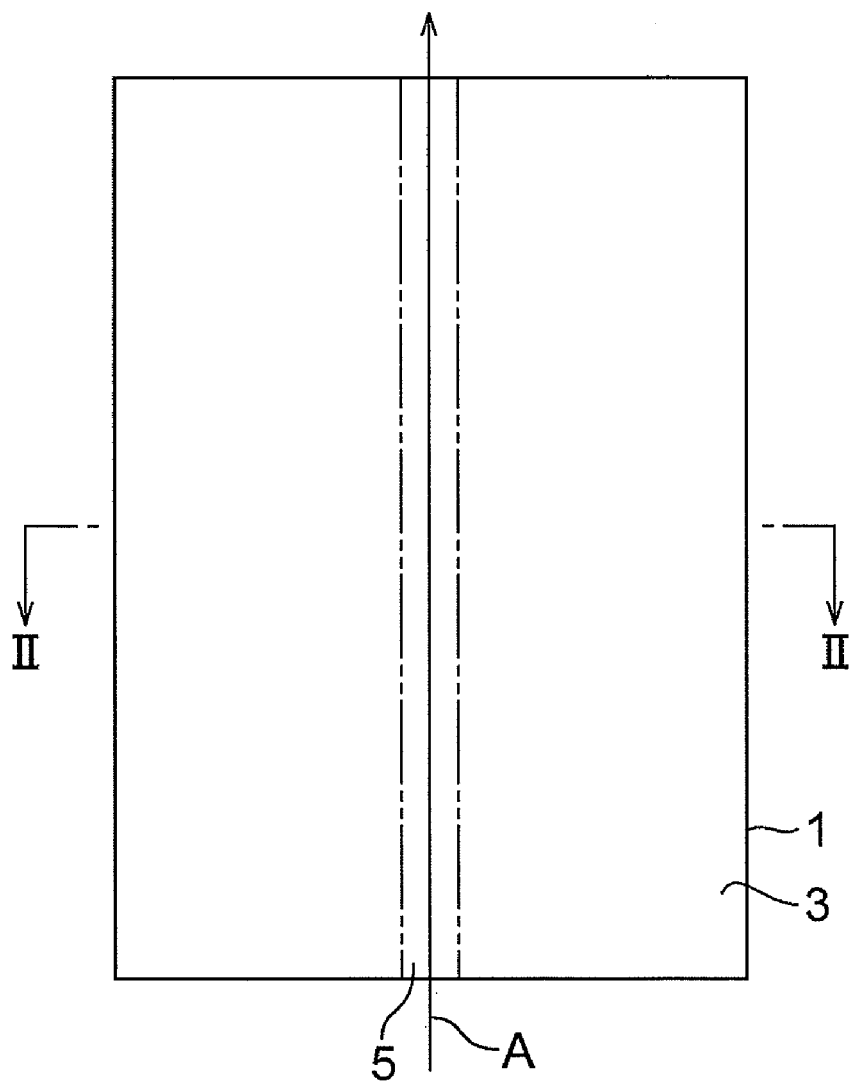
FIG. 1 is a plan view of an object to be processed during laser processing by the laser processing method in accordance with an embodiment.
Figure 2:
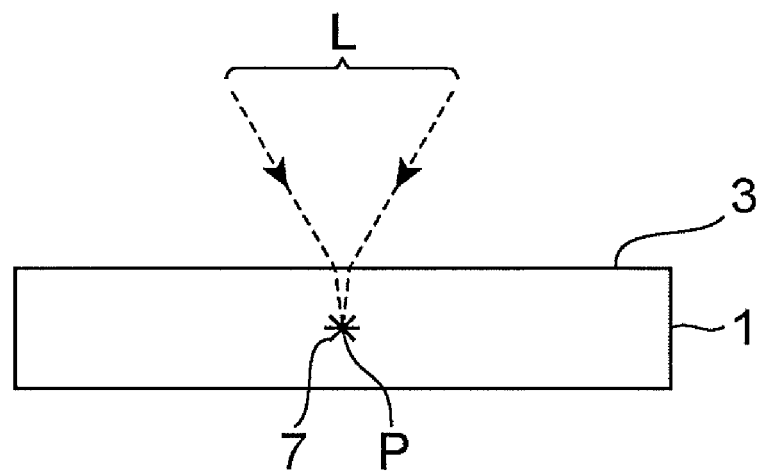
FIG. 2 is a sectional view of the object taken along the line II-II of FIG. 1.

The principle of the laser processing method in accordance with the embodiment using such multiphoton absorption will be explained with reference to FIGS. 1 to 6. As shown in FIG. 1, on a front face 3 of a wafer-like (planar) object to be processed 1, a line to cut 5 for cutting the object 1 exists. The line to cut 5 is a virtual line extending straight. As shown in FIG. 2, the laser processing method in accordance with this embodiment irradiates the object 1 with laser light L while locating a converging point P therewithin under a condition generating multiphoton absorption, so as to form a modified region 7. The converging point P is a position at which the laser light L is converged. The line to cut 5 may be curved instead of being straight, and may be a line actually drawn on the object 1 without being restricted to the virtual line.

Figure 3:
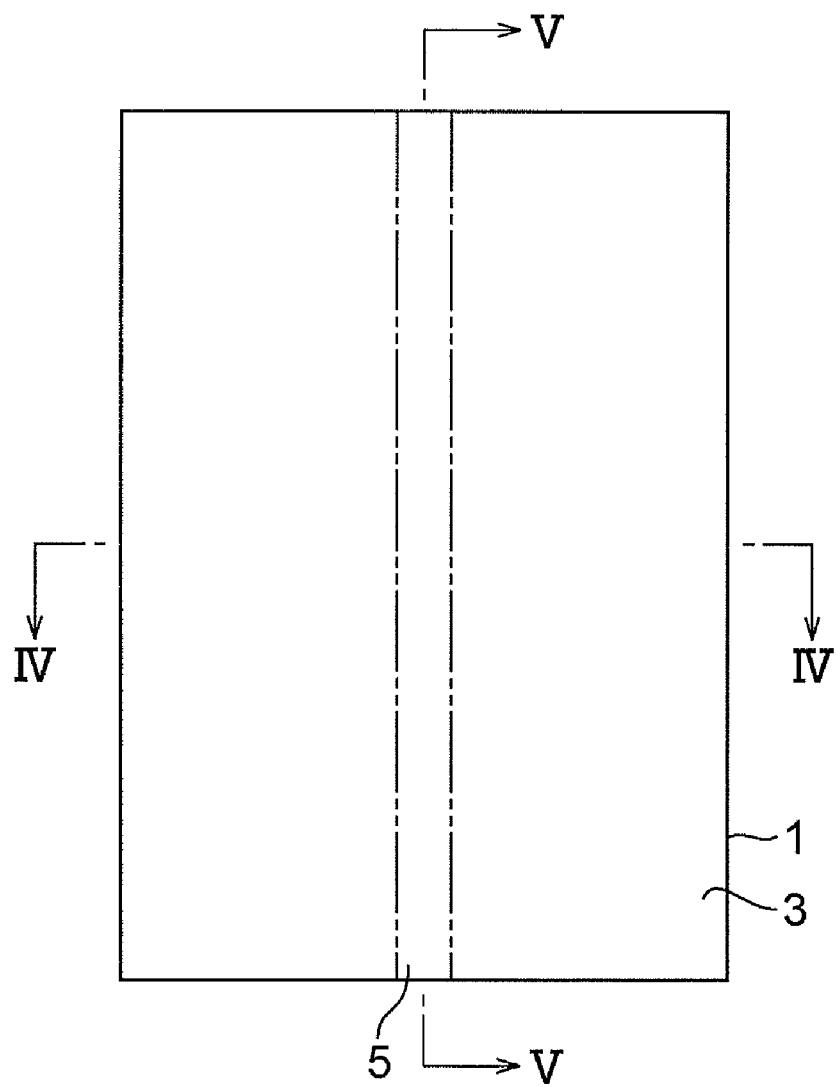
FIG. 3 is a plan view of the object after laser processing by the laser processing method in accordance with the embodiment.
Figure 4:
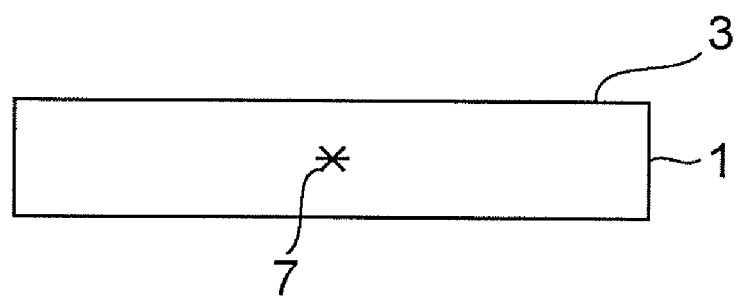
FIG. 4 is a sectional view of the object taken along the line IV-IV of FIG. 3.
Figure 5:
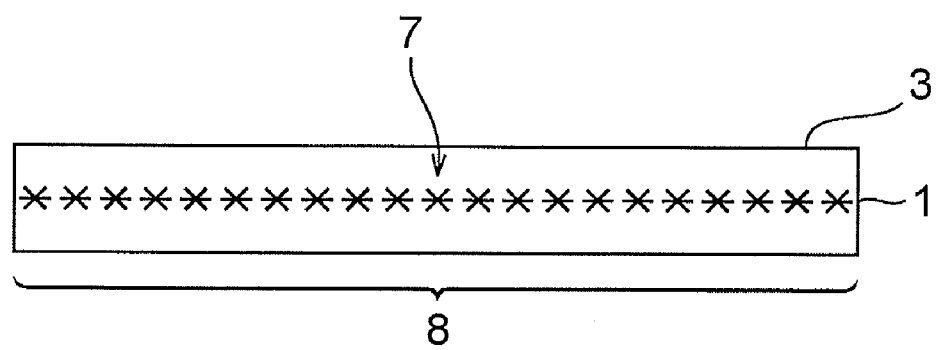
FIG. 5 is a sectional view of the object taken along the line V-V of FIG. 3.

Then, the laser light L is relatively moved along the line to cut 5 (i.e., in the direction of arrow A in FIG. 1), so as to shift the converging point P along the line to cut 5. Consequently, as shown in FIGS. 3 to 5, the modified region 7 is formed along the line to cut 5 within the object 1, and becomes a starting point region for cutting 8. The starting point region for cutting 8 refers to a region which becomes a start point for cutting (fracturing) when the object 1 is cut. The starting point region for cutting 8 may be made by forming the modified region 7 either continuously or intermittently.

In the laser processing method in accordance with this embodiment, the modified region 7 is not formed by the heat of the object 1 absorbing the laser light L. The laser light L is transmitted through the object 1, so as to generate multiphoton absorption therewithin, thereby forming the modified region 7. Hence, the front face 3 of the object 1 hardly absorbs the laser light L and thus does not melt.

Figure 6:
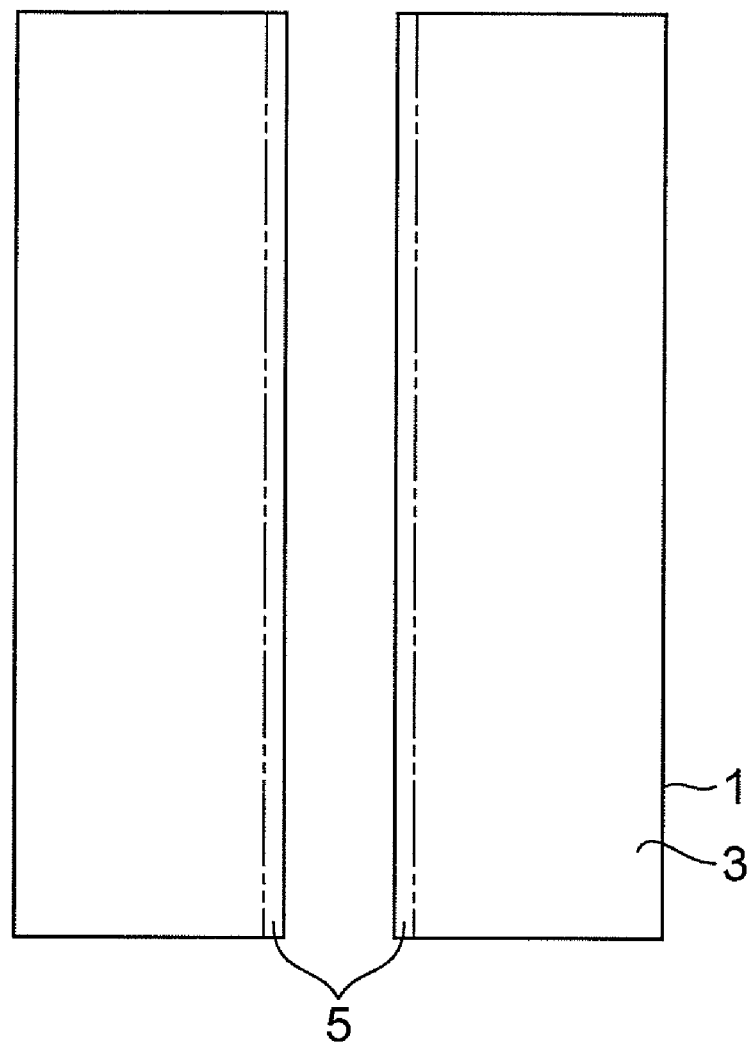
FIG. 6 is a plan view of the object cut by the laser processing method in accordance with the embodiment.

Forming the starting point region for cutting 8 within the object 1 makes it easier to generate fractures from the starting point region for cutting 8 acting as a start point, whereby the object 1 can be cut with a relatively small force as shown in FIG. 6. Therefore, the object 1 can be cut with a high precision without generating unnecessary fractures on the front face 3 of the object 1.

There seem to be the following two ways of cutting the object 1 from the starting point region for cutting 8 acting as a start point. One is where an artificial force is applied to the object 1 after the starting point region for cutting 8 is formed, so that the object 1 fractures from the starting point region for cutting 8 acting as a start point, whereby the object 1 is cut. This is the cutting in the case where the object 1 has a large thickness, for example. Applying an artificial force refers to exerting a bending stress or shear stress to the object 1 along the starting point region for cutting 8, or generating a thermal stress by applying a temperature difference to the object 1, for example. The other is where the forming of the starting point region for cutting 8 causes the object 1 to fracture naturally in its cross-sectional direction (thickness direction) from the starting point region for cutting 8 acting as a start point, thereby cutting the object 1. This becomes possible if the starting point region for cutting 8 is formed by one row of the modified region 7 when the object 1 has a small thickness, or if the starting point region for cutting 8 is formed by a plurality of rows of the modified region 7 in the thickness direction when the object 1 has a large thickness. Even in this naturally fracturing case, fractures do not extend onto the front face 3 at a portion corresponding to an area not formed with the starting point region for cutting 8 in the part to cut, so that only the portion corresponding to the area formed with the starting point region for cutting 8 can be cleaved, whereby cleavage can be controlled well. Such a cleaving method with a favorable controllability is very effective, since the object 1 to be processed such as silicon wafer has recently been apt to decrease its thickness.

The modified region formed by multiphoton absorption in the laser processing method in accordance with this embodiment encompasses the following cases (1) to (3):

(1) Case Where the Modified Region is a Crack Region Including One or a Plurality of Cracks An object to be processed (e.g., glass or a piezoelectric material made of $LiTaO_3$) is irradiated with laser light while locating a converging point therewithin under a condition with a field intensity of at least $1 \times 10^8$ ($W/cm^2$) at the converging point and a pulse width of 1 µs or less. This magnitude of pulse width is a condition under which a crack region can be formed only within the object while generating multiphoton absorption without causing unnecessary damages on the front face of the object. This generates a phenomenon of optical damage by multiphoton absorption within the object. This optical damage induces a thermal distortion within the object, thereby forming a crack region therewithin. The upper limit of field intensity is $1 \times 10^{12}$ ($W/cm^2$), for example. The pulse width is preferably 1 ns to 200 ns, for example. The forming of a crack region by multiphoton absorption is disclosed, for example, in "Internal Marking of Glass Substrate with Solid-state Laser", Proceedings of the 45th Laser Materials Processing Conference (December, 1998), pp. 23-28.

The inventors determined the relationship between field intensity and crack size by an experiment. The following are conditions of the experiment.

(A) Object to be Processed: Pyrex (Registered Trademark) Glass (With a Thickness of 700 µm)
(B) Laser
Light source: semiconductor laser pumping Nd:YAG laser
Wavelength: 1064 nm
Laser light spot cross-sectional area: $3.14 \times 10^{-8}$ $cm^2$
Oscillation mode: Q-switched pulse
Repetition frequency: 100 kHz
Pulse width: 30 ns
Output: output<1 mJ/pulse
Laser light quality: $TEM_{00}$
Polarizing property: linear polarization
(C) Condenser Lens
Transmittance at a laser light wavelength: 60%
(D) Moving Rate of the Mount Table Mounting the Object: 100 mm/sec The laser light quality of $TEM_{00}$ means that the converging characteristic is so high that convergence to about the wavelength of laser light is possible.

Figure 7:
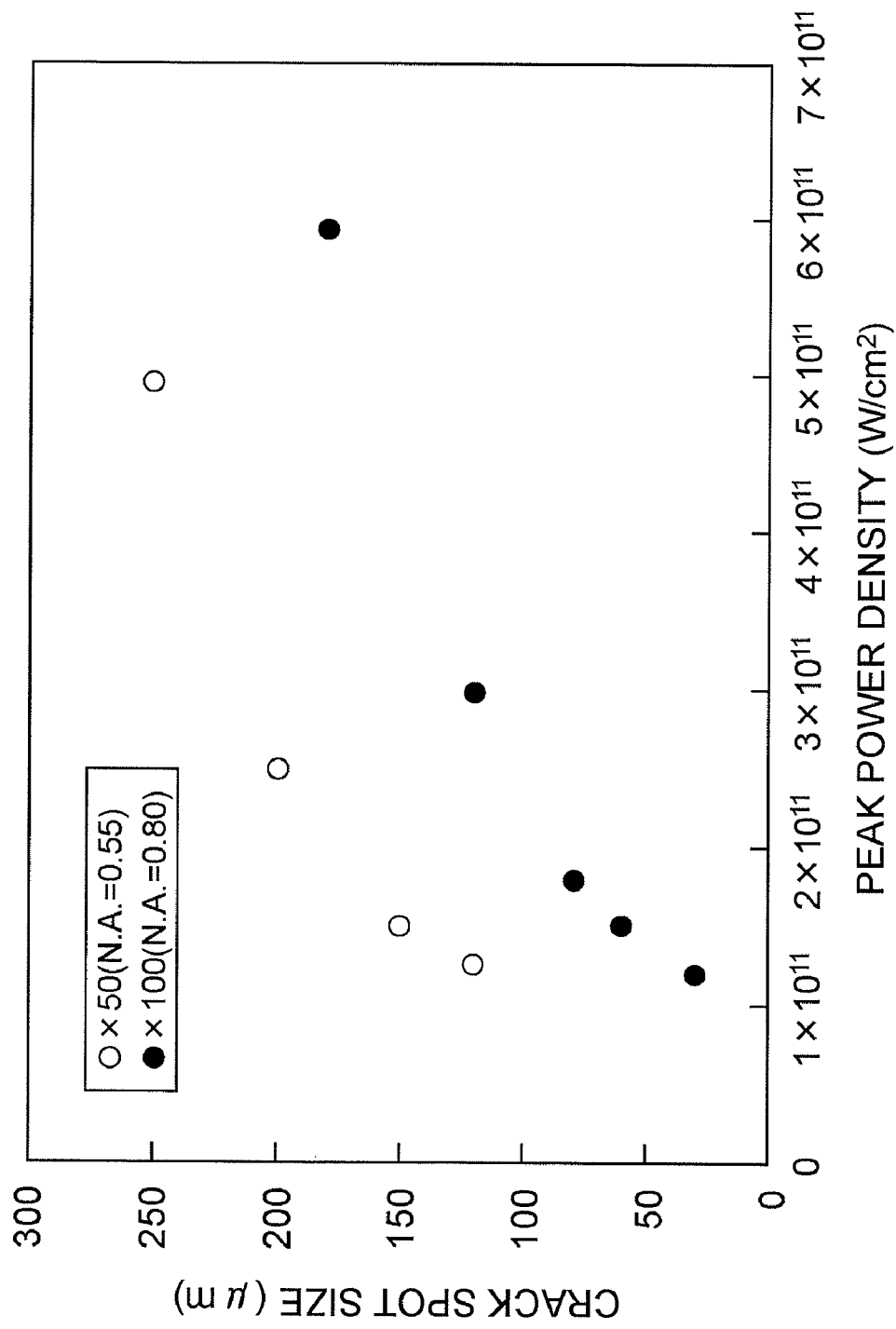
FIG. 7 is a graph showing relationships between the peak power density and crack spot size in the laser processing method in accordance with the embodiment.

FIG. 7 is a graph showing the results of the above-mentioned experiment. The abscissa indicates the peak power density. Since the laser light is pulsed laser light, the field intensity is represented by the peak power density. The ordinate indicates the size of a crack part (crack spot) formed within the object by one pulse of laser light. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the object from when the peak power density is about $10^{11}$ ($W/cm^2$) and become greater as the peak power density increases.

Figure 8:
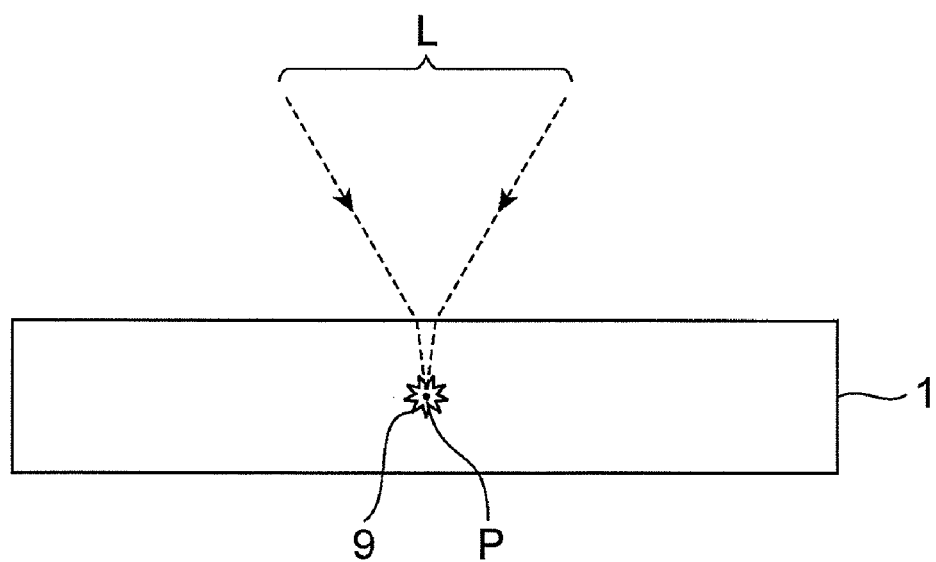
FIG. 8 is a sectional view of the object in a first step of the laser processing method in accordance with the embodiment.
Figure 9:
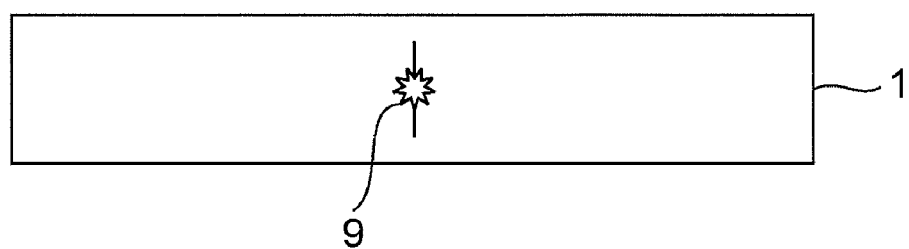
FIG. 9 is a sectional view of the object in a second step of the laser processing method in accordance with the embodiment.
Figure 10:
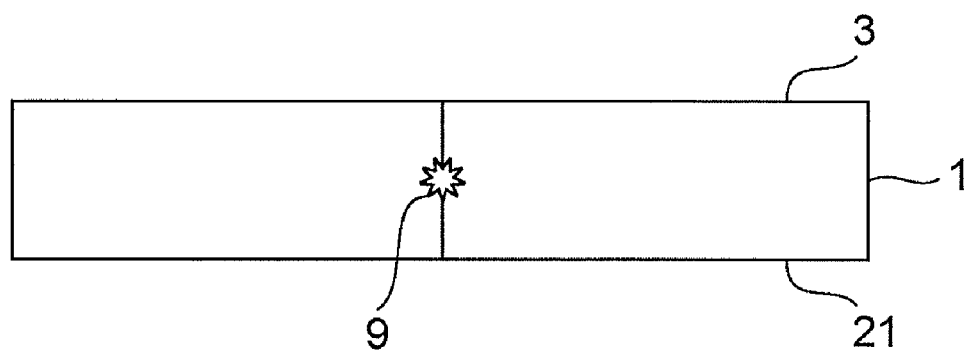
FIG. 10 is a sectional view of the object in a third step of the laser processing method in accordance with the embodiment.
Figure 11:
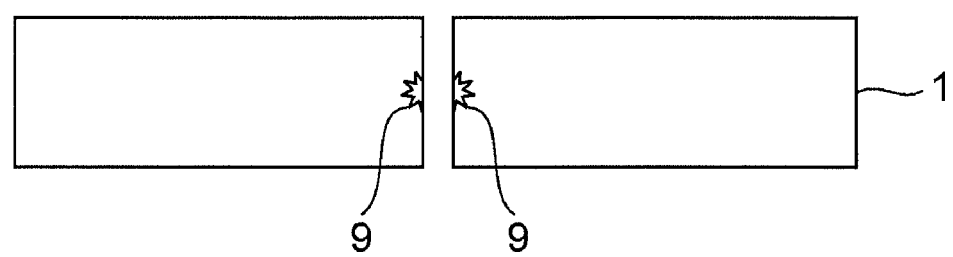
FIG. 11 is a sectional view of the object in a fourth step of the laser processing method in accordance with the embodiment.

A mechanism by which the object to be processed is cut by forming a crack region will now be explained with reference to FIGS. 8 to 11. As shown in FIG. 8, the object 1 is irradiated with laser light L while the converging point P is located within the object 1 under a condition where multiphoton absorption occurs, so as to form a crack region 9 therewithin along a line to cut. The crack region 9 is a region containing one or a plurality of cracks. Thus formed crack region 9 becomes a starting point region for cutting. A crack further grows from the crack region 9 acting as a start point (i.e., from the starting point region for cutting acting as a start point) as shown in FIG. 9, and reaches the front face 3 and rear face 21 of the object 1 as shown in FIG. 10, whereby the object 1 fractures and is consequently cut as shown in FIG. 11. The crack reaching the front face 3 and rear face 21 of the object 1 may grow naturally or as a force is applied to the object 1.

(2) Case Where the Modified Region is a Molten Processed Region

An object to be processed (e.g., semiconductor material such as silicon) is irradiated with laser light while locating a converging point within the object under a condition with a field intensity of at least $1 \times 10^8$ ($W/cm^2$) at the converging point and a pulse width of 1 µs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1 \times 10^{12}$ ($W/cm^2$), for example. The pulse width is preferably 1 ns to 200 ns, for example.

By an experiment, the inventors verified that a molten processed region was formed within a silicon wafer. The following are conditions of the experiment.

(A) Object to be Processed: Silicon Wafer (With a Thickness of 350 µm and an Outer Diameter of 4 Inches)
(B) Laser
Light source: semiconductor laser pumping Nd:YAG laser
Wavelength: 1064 nm
Laser light spot cross-sectional area: $3.14 \times 10^{-8}$ $cm^2$
Oscillation mode: Q-switched pulse
Repetition frequency: 100 kHz
Pulse width: 30 ns
Output: 20 µJ/pulse
Laser light quality: $TEM_{00}$
Polarizing property: linear polarization
(C) Condenser Lens
Magnification: ×50
N.A.: 0.55
Transmittance at a laser light wavelength: 60%

(D) Moving Rate of the Mount Table Mounting the Object: 100 mm/sec

Figure 12:
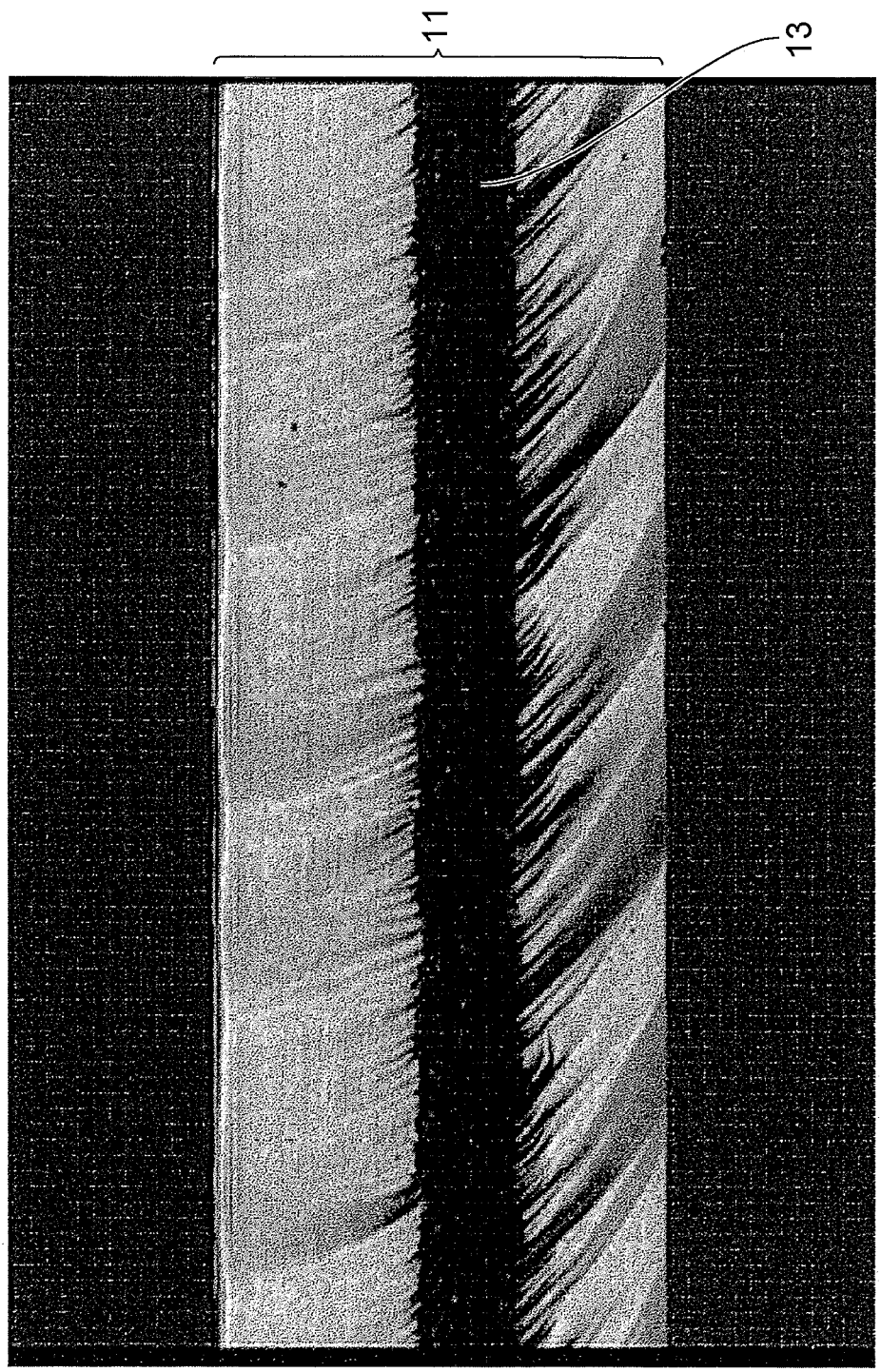
FIG. 12 is a view showing a photograph of a cut section in a part of a silicon wafer cut by the laser processing method in accordance with the embodiment.

FIG. 12 is a view showing a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 μm in the thickness direction.

Figure 13:
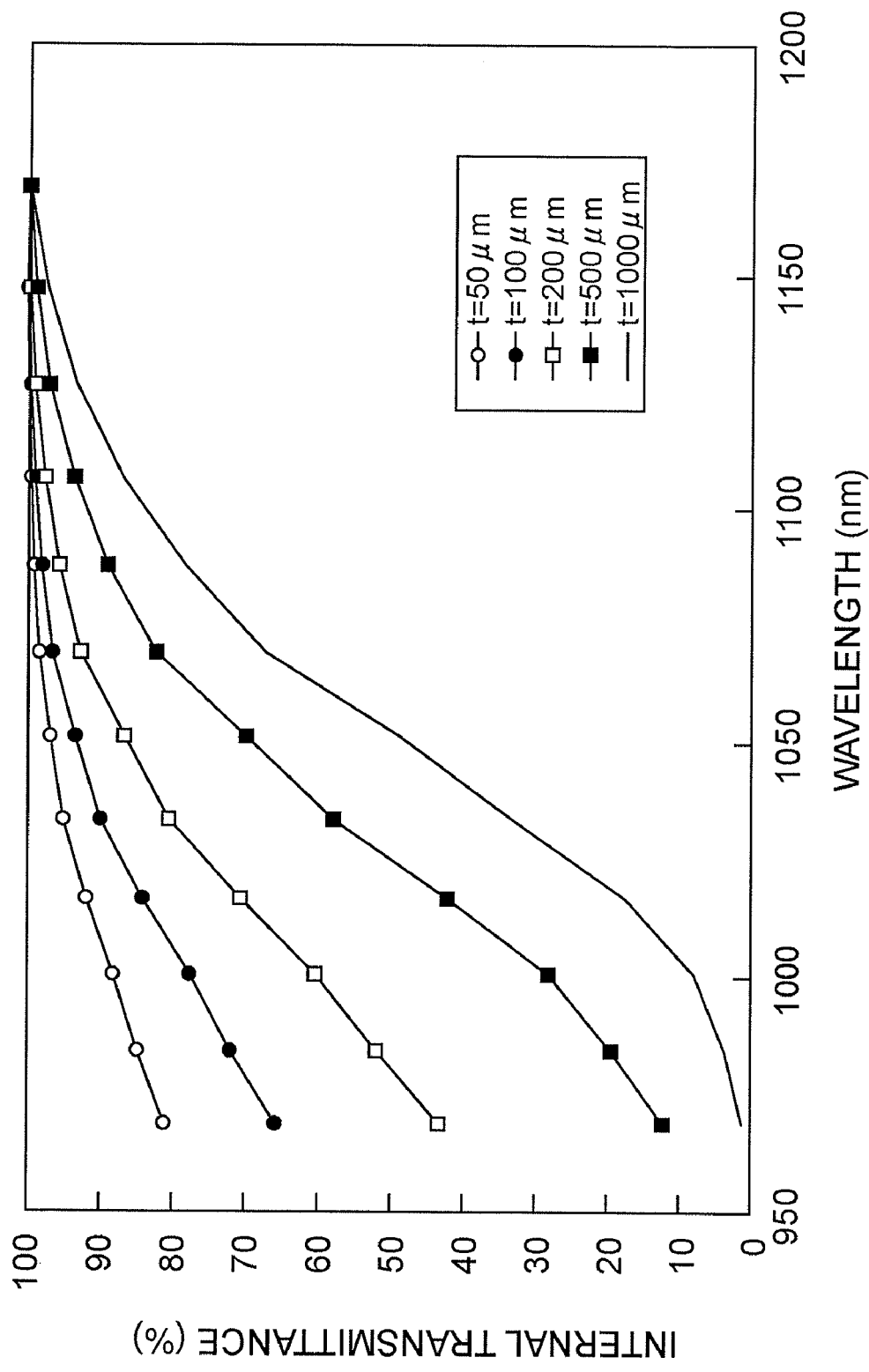
FIG. 13 is a graph showing relationships between the laser light wavelength and the transmittance within a silicon substrate in the laser processing method in accordance with the embodiment.

The fact that the molten processed region 13 is formed by multiphoton absorption will now be explained. FIG. 13 is a graph showing relationships between the laser light wavelength and the transmittance within the silicon substrate. Here, the respective reflected components on the front and rear sides of the silicon substrate are eliminated, so as to show the internal transmittance alone. The respective relationships are shown in the cases where the thickness t of the silicon substrate is 50 μm, 100 μm, 200 μm, 500 μm, and 1000 μm.

For example, at the Nd:YAG laser wavelength of 1064 nm, the laser light appears to be transmitted through the silicon substrate by at least 80% when the silicon substrate has a thickness of 500 μm or less. Since the silicon wafer 11 shown in FIG. 12 has a thickness of 350 μm, the molten processed region 13 caused by multiphoton absorption is formed near the center of the silicon wafer 11, i.e., at a part distanced from the front face by 175 μm. The transmittance in this case is 90% or more with reference to a silicon wafer having a thickness of 200 μm, whereby the laser light is absorbed only slightly within the silicon wafer 11 but is substantially transmitted therethrough. This means that the molten processed region 13 is formed within the silicon wafer 11 not by laser light absorption within the silicon wafer 11 (i.e., not by usual heating with the laser light) but by multiphoton absorption. The forming of a molten processed region by multiphoton absorption is disclosed, for example, in "Ultrashort Pulse Laser Microprocessing of Silicon", Preprints of the National Meetings of Japan Welding Society, Vol. 66 (April, 2000), pp. 72-73.

A fracture is generated in a silicon wafer from a starting point region for cutting formed by a molten processed region, acting as a start point, in a cross-sectional direction, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the starting point region for cutting to the front and rear faces of the silicon wafer encompasses a case where the fracture grows from a state in which the molten processed region forming the starting point region for cutting is molten and a case where the fracture grows when the molten processed region forming the starting point region for cutting is re-solidified from the molten state. In either case, the molten processed region is formed only within the silicon wafer, and thus is present only within the cut section after cutting as shown in FIG. 12. When a starting point region for cutting is thus formed within the object by a molten processed region, unnecessary fractures deviating from a starting point region for cutting line are harder to occur at the time of cleaving, whereby cleavage control becomes easier. Here, the molten processed region may be formed not only by multiphoton absorption but also by other absorption actions.

(3) Case Where the Modified Region is a Refractive Index Change Region

An object to be processed (e.g., glass) is irradiated with laser light while locating a converging point within the object under a condition with a field intensity of at least $1 \times 10^8$ (W/cm$^2$) at the converging point and a pulse width of 1 ns or less. When multiphoton absorption is generated within the object with a very short pulse width, the energy caused by multiphoton absorption is not converted into thermal energy, whereby an eternal structure change such as ion valence change, crystallization, or orientation polarization is induced within the object, thus forming a refractive index change region. The upper limit of field intensity is $1 \times 10^{12}$ (W/cm$^2$), for example. The pulse width is preferably 1 ns or less, for example, more preferably 1 ps or less. The forming of a refractive index change region by multiphoton absorption is disclosed, for example, in "Forming of Photoinduced Structure within Glass by Femtosecond Laser Irradiation", Proceedings of the 42nd Laser Materials Processing Conference (November, 1997), pp. 105-111.

Though the cases (1) to (3) are explained in the foregoing as a modified region formed by multiphoton absorption, a starting point region for cutting may be formed as follows while taking account of the crystal structure of a wafer-like object to be processed, its cleavage characteristic, and the like, whereby the object can be cut with a favorable precision by a smaller force from the starting point region for cutting acting as a start point.

That is, in the case of a substrate made of a monocrystal semiconductor having a diamond structure such as silicon, it will be preferred if a starting point region for cutting is formed in a direction extending along a (111) plane (first cleavage plane) or a (110) plane (second cleavage plane). In the case of a substrate made of a group III-V compound semiconductor of sphalerite structure such as GaAs, it will be preferred if a starting point region for cutting is formed in a direction extending along a (110) plane. In the case of a substrate having a crystal structure of hexagonal system such as sapphire (Al$_2$O$_3$), it will be preferred if a starting point region for cutting is formed in a direction extending along a (1120) plane (A plane) or a (1100) plane (NM plane) while using a (0001) plane (C plane) as a principal plane.

When the substrate is formed with an orientation flat in a direction to be formed with the above-mentioned starting point region for cutting (e.g., a direction extending along a (111) plane in a monocrystal silicon substrate) or a direction orthogonal to the former direction, the starting point region for cutting extending in the direction to be formed with the starting point region for cutting can be formed easily and accurately with reference to the orientation flat.

The preferred embodiment of the present invention will now be explained.

Figure 14:
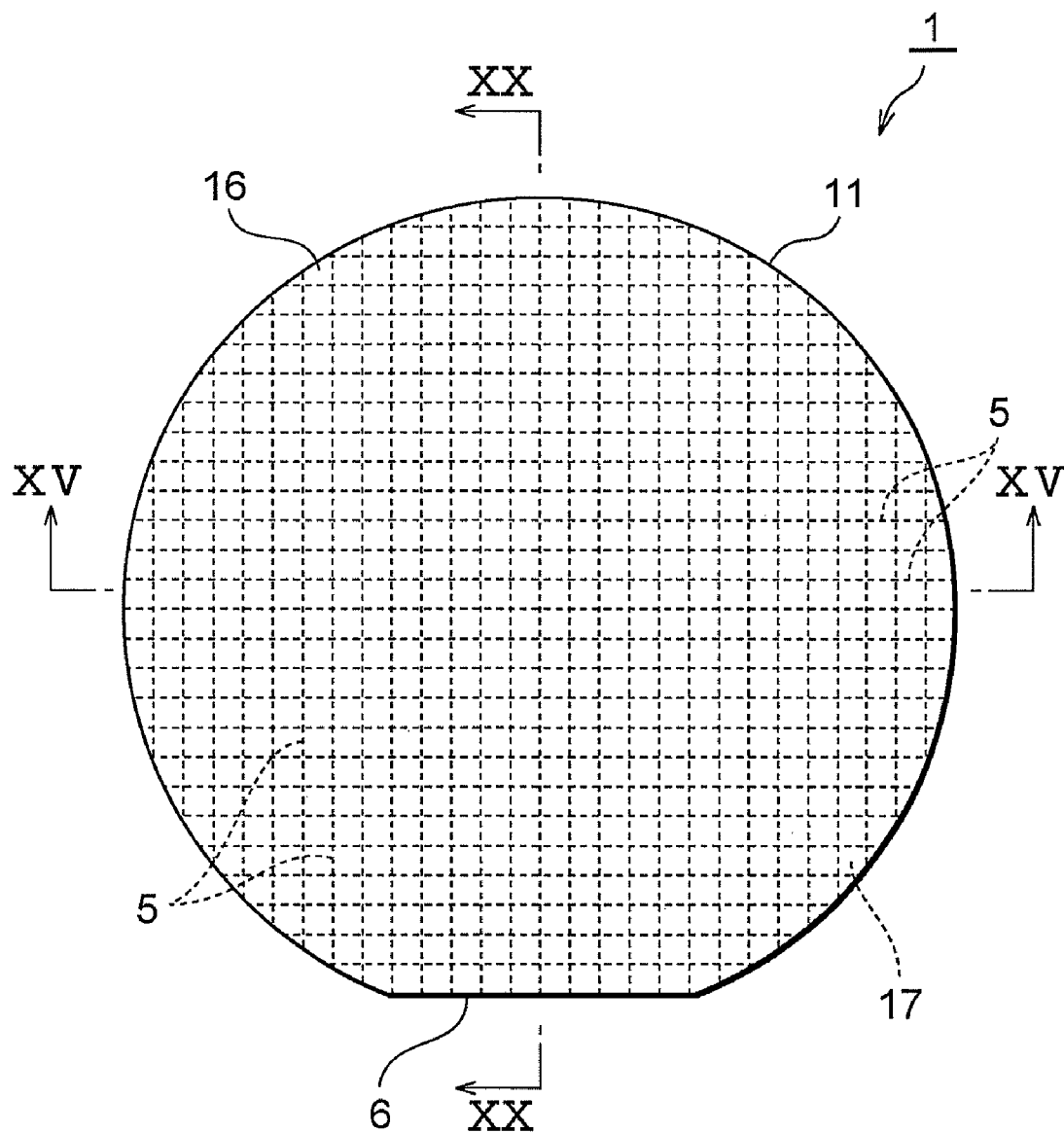
FIG. 14 is a plan view of an object to be processed for which the laser processing method in accordance with the embodiment is employed.
Figure 15:
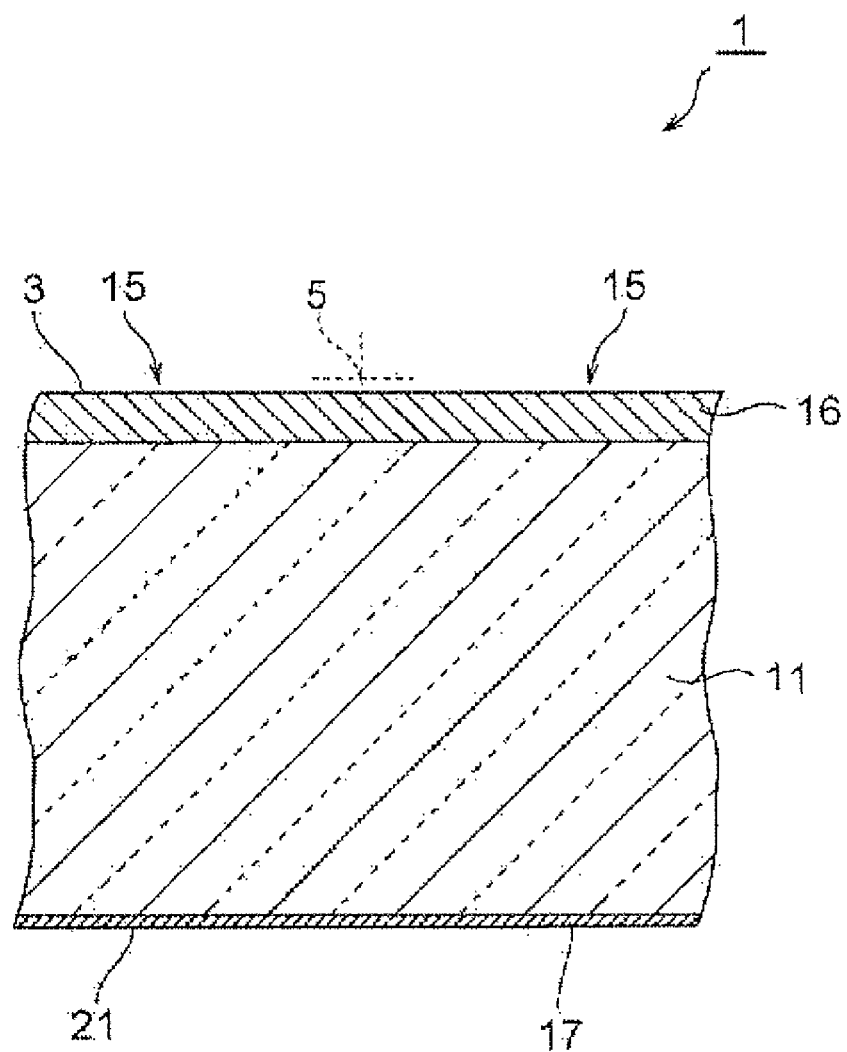
FIG. 15 is a partial sectional view taken along the line XV-XV of FIG. 14.

As shown in FIGS. 14 and 15, an object to be processed 1 is a so-called MEMS wafer comprising a silicon wafer (semiconductor substrate) 11 having a thickness of 300 μm, a functional device layer 16 which is formed on the front face of the silicon wafer 11 while including a plurality of functional devices 15, and a metal film 17 formed on the rear face of the silicon wafer 11. A number of functional devices 15, examples of which include mechanical constituent parts, sensors, actuators, and electronic circuits, are formed like a matrix in directions parallel and perpendicular to an orientation flat 6 of the silicon wafer 11. The metal film 17 is made of gold and has a thickness of 3 μm.

Figure 16:
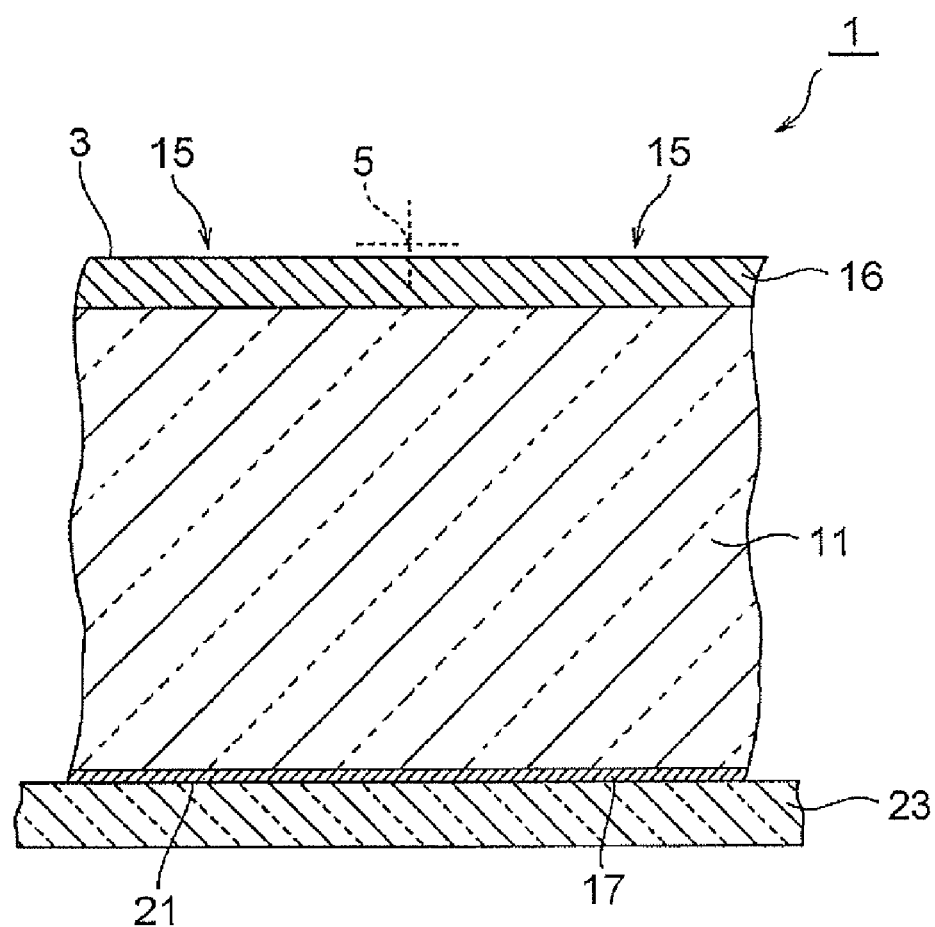
FIG. 16 is a partial sectional view of the object for explaining the laser processing method in accordance with the embodiment.

Thus constructed object 1 is cut into the functional devices 15 in the following manner. First, as shown in FIG. 16, an expandable tape 23 is attached to the rear face (other face) 21 of the object 1, i.e., the rear face of the metal film 17. Then, the object 1 is secured onto a mount table (not shown) of a laser processing apparatus with the functional device layer 16 facing up.

Figure 17:
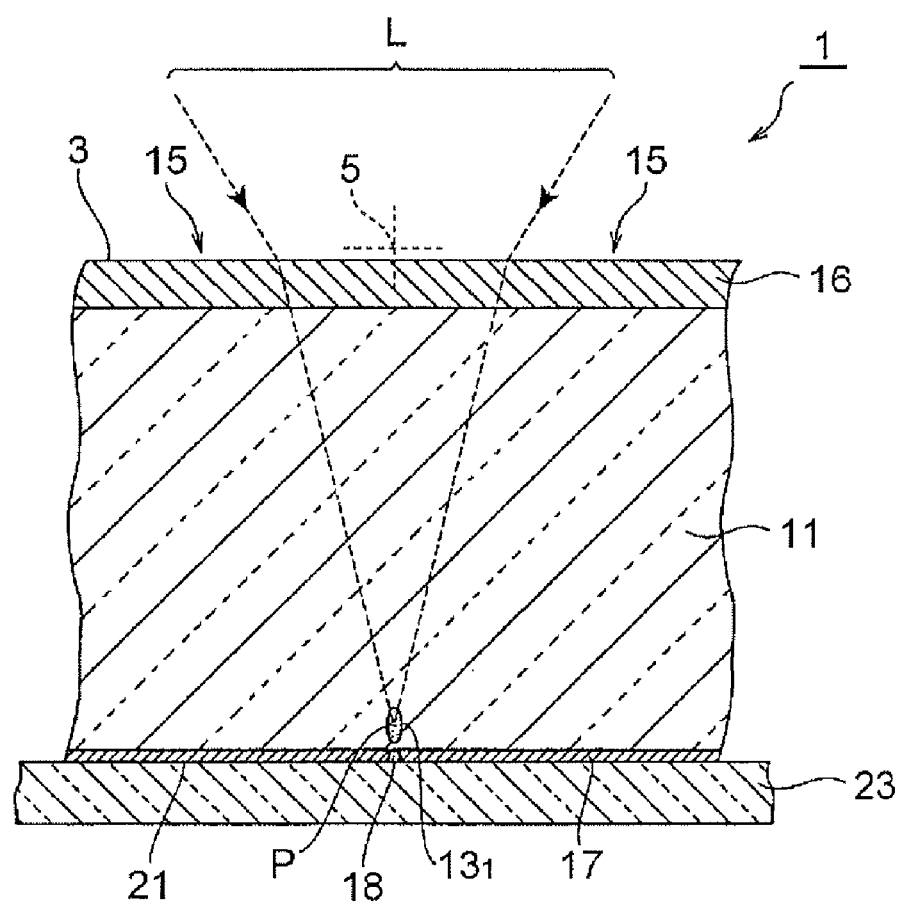
FIG. 17 is a partial sectional view of the object for explaining the laser processing method in accordance with the embodiment.

Subsequently, as shown in FIG. 17, the object 1 is irradiated with laser light L while using the front face (one face) 3 of the object 1, i.e., the front face of the functional device layer 16, as a laser light entrance surface and locating a converging point P at a position (within the silicon wafer 11) distanced by 295 μm from the front face of the silicon wafer 11, and the mount table is moved so as to scan the converging point P along lines to cut 5 (see broken lines in FIG. 14) which are set like grids passing between the functional devices 15, 15 adjacent to each other.

This forms a weakened region 18 having a predetermined depth from the rear face 21 along the lines to cut 5 in the metal film 17 simultaneously with a molten processed region $13_1$ within the silicon wafer 11 in the vicinity of the rear face 21 along the lines to cut 5. In this case, the laser light is irradiated under a condition with a pulse width of 150 ns and energy of 15 μJ. The above-mentioned "position distanced by 295 μm from the front face of the silicon wafer 11" means a theoretical "position where the converging point P is located" without taking account of spherical aberration and the like.

Figure 18:
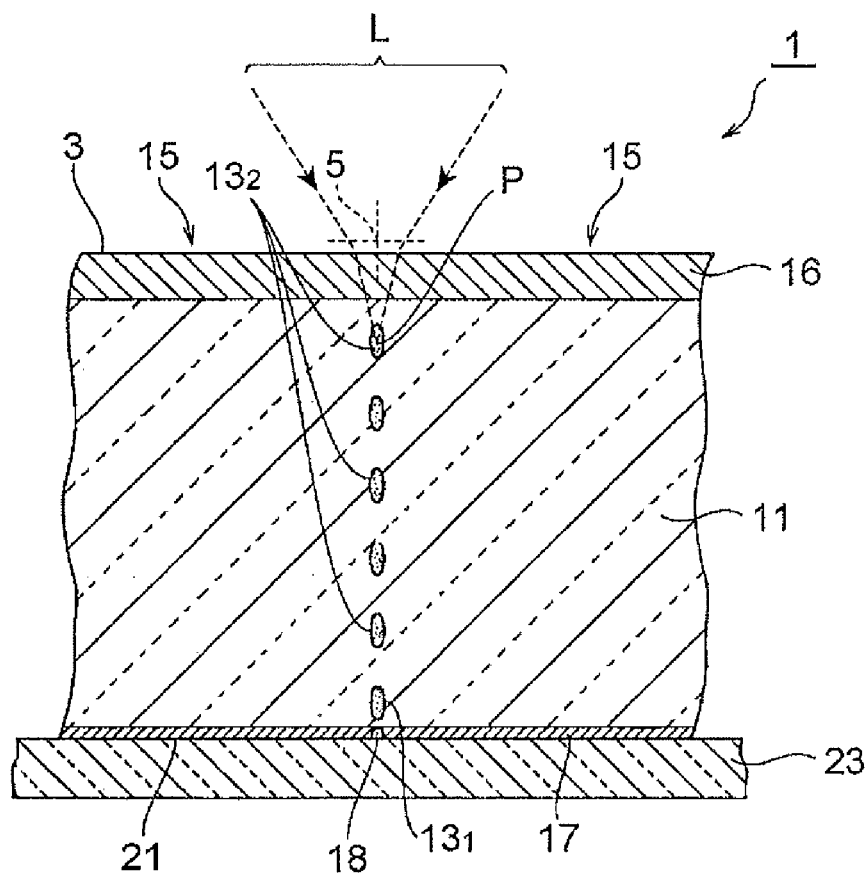
FIG. 18 is a partial sectional view of the object for explaining the laser processing method in accordance with the embodiment.

Further, as shown in FIG. 18, the object 1 is irradiated with the laser light L while using the front face 3 of the object 1 as a laser light entrance surface and locating the converging point P within the silicon wafer 11, and the mount table is moved so as to scan the converging point P along the lines to cut 5 set like grids passing between the functional devices 15, 15 adjacent to each other.

The scanning of the converging point P along the lines to cut 5 is performed five times per line to cut 5 with respective distances from the front face of the silicon wafer 11 to the position where the converging point P is located, so as to form five rows of molten processed regions $13_2$ between the molten processed region $13_1$ and the front face of the silicon wafer 11 along the lines to cut 5. The number of rows of molten processed regions $13_2$ formed within the silicon wafer 11 per line to cut 5 is not limited to 5 but varies depending on the thickness of the silicon wafer 11 and the like. The molten processed regions $13_1$, $13_2$ may include cracks.

Figure 19:
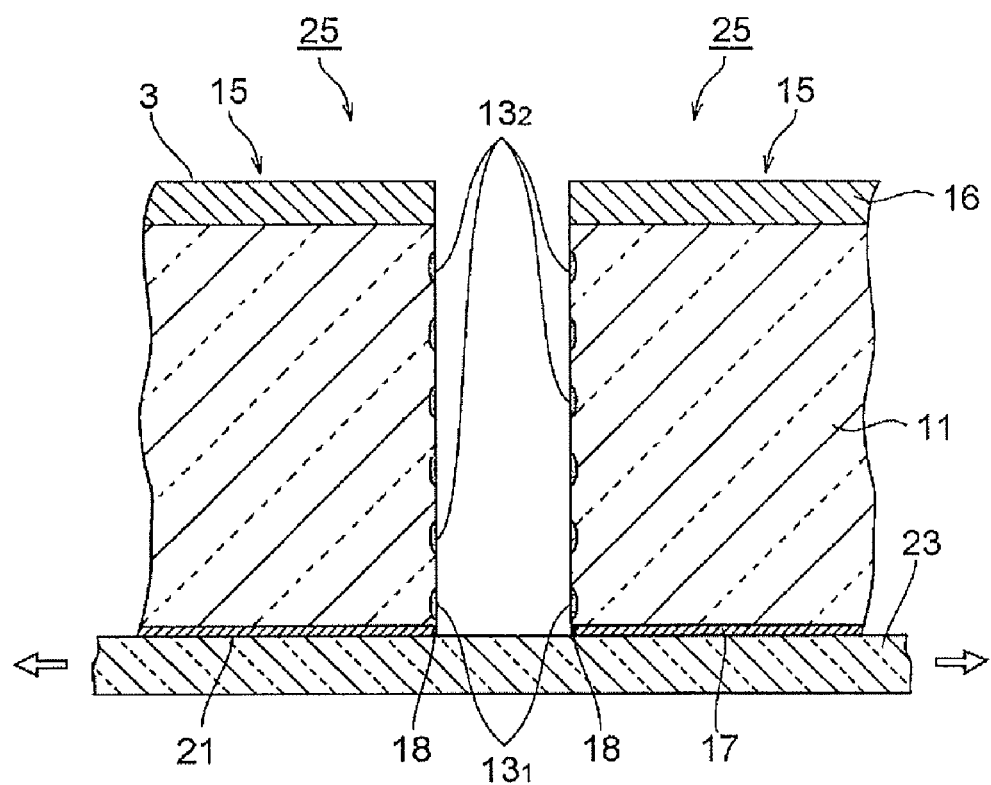
FIG. 19 is a partial sectional view of the object for explaining the laser processing method in accordance with the embodiment.

Subsequently, as shown in FIG. 19, the expandable tape 23 is expanded, so as to cut the object 1 along the lines to cut 5 from the molten processed regions $13_1$, $13_2$ and weakened region 18 acting as a cutting start point. At this time, since the expandable tape 23 is expanded, a plurality of semiconductor chips 25 obtained by the cutting are separated from each other.

While six rows of molten processed regions $13_1$, $13_2$ aligning in the thickness direction of the object are formed along each line to cut 5 in the above-mentioned laser processing method, the weakened region 18 having a predetermined depth is formed along the line to cut 5 when forming the molten processed region $13_1$ closest to the rear face 21 of the object 1 as explained in the foregoing. Though the rear face 21 of the object 1 is the rear face of the metal film 17 here, the object 1 can accurately be cut along the lines to cut 5 with a relatively small external force, since the weakened region 18 having a predetermined depth is formed in the metal film 17 along the lines 5 to cut.

Figure 20:
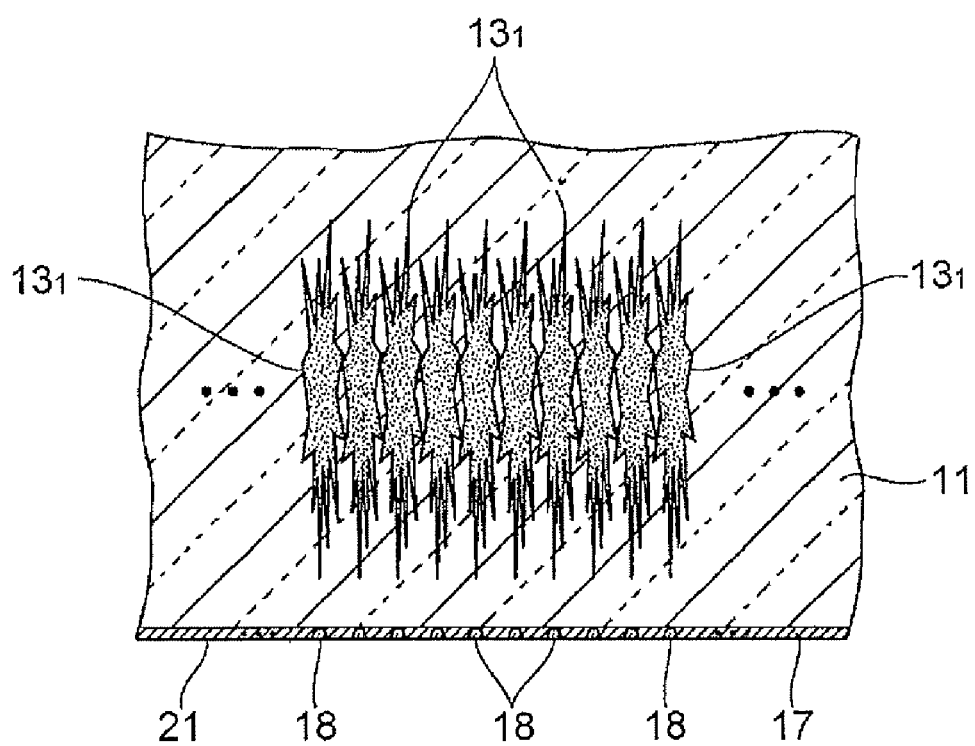
FIG. 20 is a partial sectional view taken along the line XX-XX of FIG. 14.

As shown in FIG. 20, the molten processed region $13_1$ and weakened region 18 formed by irradiation with one pulse of laser light L oppose each other while being separated from each other in the thickness direction of the object 1. Consequently, the molten processed region $13_1$ closest to the rear face 21 of the object 1 is formed at a position inwardly separated from the rear face 21 by a predetermined distance. Therefore, particles can reliably be prevented from occurring not only from the molten processed regions $13_2$ but also from the molten processed region $13_1$.

Further, as shown in FIG. 20, the weakened region 18 formed by irradiation with pulse-oscillated laser light L exists like a dotted line along the lines to cut 5. This makes it easier for stresses to concentrate at the weakened region 18 when exerting an external force with the expandable tape 23 on the object 1. Therefore, the object 1 can be cut along the lines to cut 5 with a smaller external force.

Figure 21:
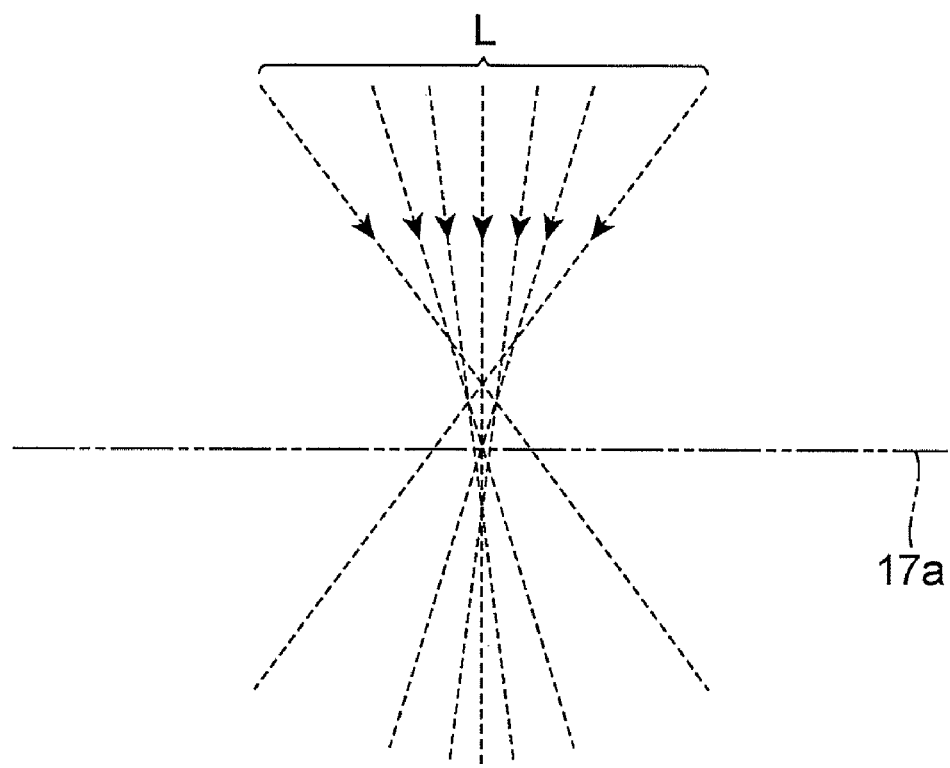
FIG. 21 is a view for explaining the principle of the laser processing method in accordance with the embodiment.

The principle by which the weakened region 18 is formed in the rear face 21 of the object 1 simultaneously with the molten processed region $13_1$ within the silicon wafer 11 will now be explained. When the silicon wafer 11 is irradiated with the laser light L while locating the converging point P therewithin in the vicinity of the rear face 21, the center light beam and marginal light beams lower their degrees of convergence under the influence of spherical aberration and thus fail to converge at a single point, whereby the converging positions of the light beams, those of marginal light beams in particular, shift from each other in the optical axis direction as shown in FIG. 21. Hence, a part of the light beams converge within the metal film 17 (on the lower side of the front face 17a of the metal film 17 in FIG. 21). This forms the weakened region 18 having a predetermined depth in the rear face 21 of the object 1, i.e., the rear face of the metal film 17. The part of light beams contributing to forming the weakened region 18 has such a small energy that the expandable tape 23 hardly incurs damages such as melting.

The present invention is not limited to the above-mentioned embodiment.

Figure 22:
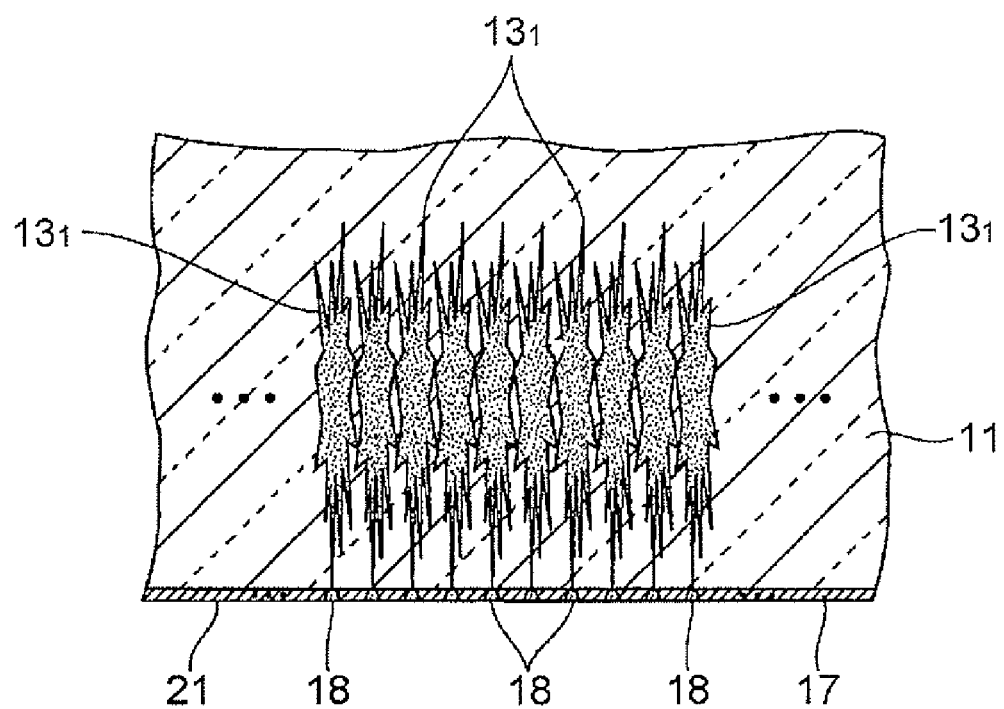
FIG. 22 is a partial sectional view taken along the line XX-XX of FIG. 14.

For example, the molten processed region $13_1$ and weakened region 18 formed by irradiation with one pulse of laser light L oppose each other while being separated from each other in the thickness direction of the object 1 in the above-mentioned embodiment, but may be in contact or continuous with each other as shown in FIG. 22. Even in the latter case, comb-like unmodified regions remain at the end part on the rear face 21 side in the portions extending along the lines to cut 5 in the object 1, so that stresses are easier to concentrate at the molten processed region $13_1$ and weakened region 18 when exerting an external force on the object 1, whereby the object 1 can be cut along the lines to cut 5 with a smaller external force. In this case, the laser light is irradiated under a condition with a pulse width of 150 ns and energy of 15 μJ.

Though the rear face 21 of the object 1 is the rear face of the metal film 17 in the above-mentioned embodiment, the object 1 may be free of the metal film 17, for example, so that the rear face 21 of the object 1 is the rear face of the silicon wafer 11. Examples of the functional devices 15 also include semiconductor operating layers formed by crystal growth, light-receiving devices such as photodiodes, light-emitting devices such as laser diodes, and circuit devices formed as circuits.

Though the above-mentioned embodiment employs the front face 3 of the object 1 as the laser light entrance surface, the rear face 21 of the object 1 may be used as the laser light entrance surface. When the rear face 21 of the object 1 is used as the laser light entrance surface, the object 1 is cut into a plurality of semiconductor chips 25 as follows, for example. A protective tape is attached to the front face of the functional device layer 16 and, while the functional device layer 16 is protected by the protective tape, the protective tape holding the object 1 is secured to the mount table of the laser processing apparatus. Then, the object 1 is irradiated with the laser light L while using the rear face 21 of the object 1 as the laser light entrance surface and locating the converging point P within the silicon wafer 11, so as to form the molten processed regions $13_1$, $13_2$ and weakened region 18 along the lines to cut 5. Subsequently, the protective tape secured to the mount table is released therefrom together with the object 1. Then, the expandable tape 23 is attached to the rear face 21 of the object 1, the protective tape is peeled off from the front face of the functional device layer 16, and thereafter the expandable tape 23 is expanded, so as to cut the object 1 along the lines to cut 5 from the molten processed regions $13_1$, $13_2$ and weakened region 18 acting as a cutting start point and separate the plurality of semiconductor chips 25 obtained by the cutting from each other.

Though the above-mentioned embodiment forms the molten processed regions $13_1$, $13_2$ within the silicon wafer 11, other modified regions such as crack regions and refractive index change regions may be formed within wafers made of other materials such as glass and dielectric materials.

INDUSTRIAL APPLICABILITY

The present invention can prevent particles from occurring and can cut an object to be cut along a line to cut with a relatively small external force.

The invention claimed is:

1. A laser processing method of irradiating a planar object to be processed including a semiconductor substrate with laser light while using one face of the planar object as a laser light entrance surface, so as to form a plurality of rows of modified regions to become a cutting start point along a line to cut the planar object within the semiconductor substrate such that the modified regions align in a thickness direction of the planar object;

the method comprising the steps of:
irradiating the planar object with the laser light via the laser light entrance surface of the planar object;
locating a converging point at a position within the semiconductor substrate;
forming a weakened region having a predetermined depth along the line to cut simultaneously with a modified region closest to an opposite face of the planar object that is opposite to the one face of the planar object in the plurality of rows of modified regions; and
forming a modified region other than the modified region closest to the opposite face in the plurality of rows of modified regions,
wherein a portion of the light beams of the laser light that is pulse-oscillated while the converging point is located shifts to the optical axis direction of the laser light and converges, whereby the weakened region is formed as part of a dotted line along the line to cut,
wherein the opposite face is a surface of a metal film in the object.

2. A laser processing method according to claim 1, wherein the modified region closest to the opposite face and the weakened region are formed such as to be separated from each other.

3. A laser processing method according to claim 1, including the step of cutting the object along the line to cut from the plurality of rows of modified regions and weakened region acting as a cutting start point.

4. A laser processing method according to claim 1, wherein the plurality of rows of modified regions include a molten processed region.

* * * * *